United States Patent
Bogorad et al.

[11] Patent Number: 5,919,316
[45] Date of Patent: Jul. 6, 1999

[54] SPACECRAFT SOLAR ARRAY DESIGN TO CONTROL DIFFERENTIAL CHARGING

[75] Inventors: Alexander Bogorad, Bridgewater; Charles Kenneth Bowman, Jr., East Windsor, both of N.J.; William Raymond Krummann, Yorba Linda, Calif.; William Richard Hart, Frenchtown, N.J.

[73] Assignee: The United States of America as represented by the Secretary of the Air Force, Washington, D.C.

[21] Appl. No.: 08/884,683

[22] Filed: Jun. 27, 1997

[51] Int. Cl.[6] .................................................. H01L 31/00
[52] U.S. Cl. ............................................ 136/256; 136/244
[58] Field of Search ....................................... 136/244, 256

[56] References Cited

U.S. PATENT DOCUMENTS

| | | | |
|---|---|---|---|
| 2,780,765 | 2/1957 | Chapin et al. | 136/256 |
| 3,255,047 | 6/1966 | Escoffery | 136/256 |
| 3,261,074 | 7/1966 | Beauzee | 136/256 |
| 3,450,568 | 6/1969 | Mann | 136/256 |
| 3,493,822 | 2/1970 | Iles | 136/256 |
| 3,527,619 | 9/1970 | Miley | 136/244 |
| 4,289,920 | 9/1981 | Hovel | 136/244 |
| 4,697,042 | 9/1987 | Schilling | 136/244 |
| 5,620,904 | 4/1997 | Hanoka | 136/256 |

FOREIGN PATENT DOCUMENTS 60-783   1/1985   Japan ..................... 136/256

*Primary Examiner*—Roland Martin
*Attorney, Agent, or Firm*—Robert L. Nathans

[57] ABSTRACT

Numerous undesirable prior art epoxy beads or pads of metallization, employed to prevent unacceptable electrostatic charge buildup upon the solar cell coverglasses of solar cell array panels deployed in outer space, are eliminated by causing the charge conducting semiconductive coverglass layers to be wrapped around edge portions of each coverglass, to readily facilitate charge drainage of the electrostatic charge buildup.

13 Claims, 1 Drawing Sheet

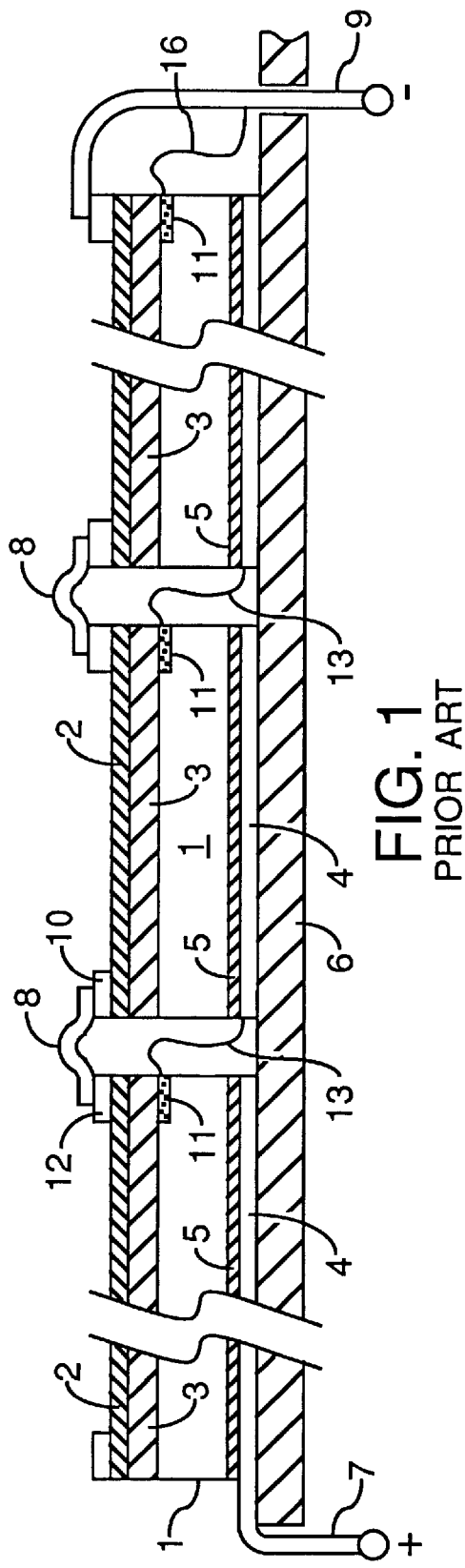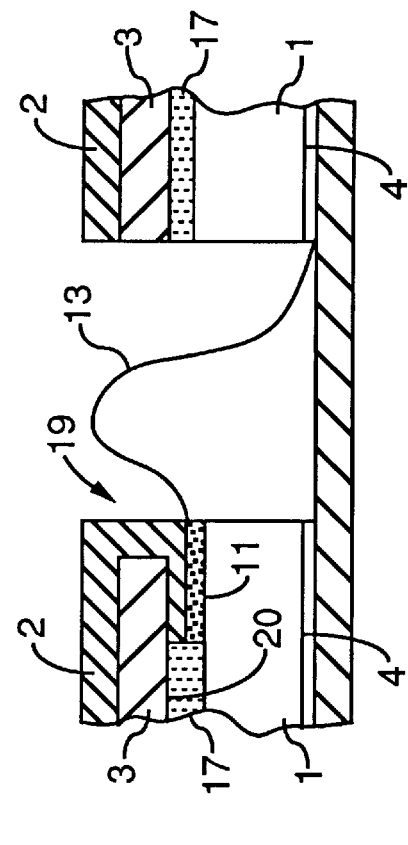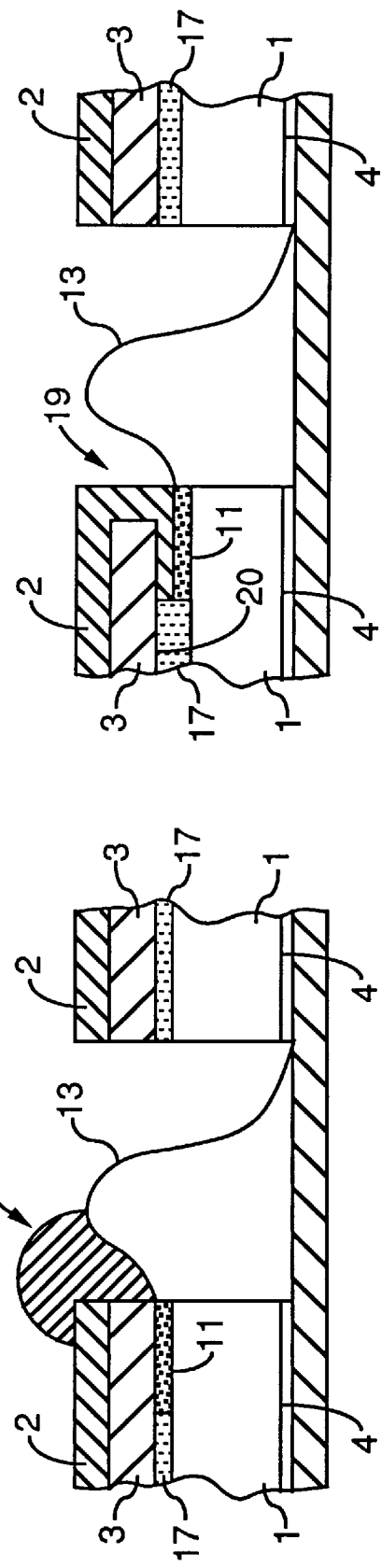
FIG. 1 PRIOR ART
FIG. 2 PRIOR ART
FIG. 3

SPACECRAFT SOLAR ARRAY DESIGN TO CONTROL DIFFERENTIAL CHARGING

STATEMENT OF GOVERNMENT INTEREST

This invention may be used by or for the Government for governmental purposes without the payment of any royalty thereon.

BACKGROUND OF THE INVENTION

Arrays of numerous solar cells are affixed to panels mounted upon satellites in order to convert visible light emitted by the sun into electrical power. When such satellites operate at altitudes in the range of one to ten earth radii, the natural plasma environment may deposit electric charge on the cell protective coverglasses affixed to upper surfaces of the solar cells. The electrons at these altitudes are extremely energetic and a large amount of charge may accumulate, possibly enough to charge the coverglasses to 20,000 volts. This exceeds the voltage at which electrostatic discharging is known to occur, as the observed discharge threshold is about 1000 volts.

To prevent the production of voltages exceeding the discharge threshold, an indium tin oxide (ITO) layer is typically deposited upon the upper or space-facing side of each coverglass, and the ITO layer must be electrically grounded to prevent excessive charge buildup and detrimental discharges. However, there are between 5000 and 20,000 solar cells and associated coverglasses on each communication satellite. If any coverglass grounding connection fails, by becoming an electrically open circuit, the coverglass to which it attaches can build up to a voltage that exceeds the discharge voltage to produce unacceptable performance or cell damage. Two types of grounding techniques, to be described below, have been employed for preventing the destructive charge buildup on the coverglasses. These techniques add hundreds of hours of labor cost to the manufacturing cost of every conductively coated solar array. Moreover, either the epoxy bead or the pad of metallization used in these prior art techniques, will block off some incident light and thus reduce the power output of each cell.

BRIEF SUMMARY OF A PREFERRED EMBODIMENT OF THE INVENTION

The aforesaid numerous undesirable prior art epoxy beads or pads of metallization are eliminated by causing the charge conducting semiconductive coverglass layers to be wrapped around edge portions of each coverglass, to thus electrically contact the photocell interconnecting members of the prior art, which couple the solar cells together to form the solar cell array. The interconnect members also drain excessive coverglass charges to electrical ground.

BRIEF DESCRIPTION OF THE DRAWINGS

Other features and advantages of the invention will become more apparent upon study of the detailed description taken in conjunction with the following drawings in which:

FIG. 1 illustrates a photocell array employing the aforesaid prior art pad metallization technique;

FIG. 2 illustrates a photocell array employing the aforesaid prior art conductive epoxy bead technique; and FIG. 3 illustrates an embodiment of the invention.

DETAILED DESCRIPTION OF A PREFERRED EMBODIMENT OF THE INVENTION

A first linear array of photocells 1 of the prior art is shown in FIG. 1. Each cell 1 is positioned between a thin metallic strip 11 called an N-bar and a lower conductive layer 5, affixed to substrate 6 via adhesive layer 4. The linear array is a series circuit of solar cells in a line, typically 50–250 cells, by virtue of the interconnects 13 formed between each N bar 11 and the lower conductive cell electrode portions 5 as shown in FIG. 1. A plurality of these linear arrays can be connected in parallel to form a solar cell panel in the conventional manner. The aforesaid cover glass elements 3 are cemented to cells 1 via clear adhesive layers 17, shown in FIG. 2, which readily transmit visible light. Coverglass elements 3 are typically of fused silica or ceria-doped borosilicate glass. The upper charge conducting semiconductive layers 2 are typically made of indium oxide or indium tin oxide (ITO) as well known to workers in the art. These ITO layers 2 will be referred to hereinafter as upper semiconductive layers or ITO layers and are transparent enough to pass visible light with almost no attenuation. These ITO layers have a sufficiently high resistivity to prevent a significant amount of power from being shunted around the cell, and have a sufficiently low resistivity to allow the aforesaid detrimental built up of charge to flow into the interconnects 13 and thus off of the coverglass, when the charging at the central portions of the glass reach several hundred volts, well below the aforesaid threshold for the detrimental discharging, mentioned hereinabove. The left hand positive array terminal 7 is connected to lower conductive layer 5 of the left hand cell and the right hand negative array terminal of the array 9, which could be electrical ground, is connected to the N-bar of the cell at the extreme right by conductor 16. The lower conductive photocell layers 5 are affixed to substrate 6 via a room temperature vulcanizing silicone adhesive material 4 which will endure the temperature extremes of outer space.

In the prior art FIG. 1 arrangement, conductive wires 8 are soldered between conductive spots 10 and 12 positioned on ITO layers 2 over at least one corner portion of each of fifty or more coverglasses. These serially connected numerous wires 8 allow the detrimental charges to flow off of the coverglass portions when the charging thereof reaches several hundred volts, and wires 8 thus function as charge draining devices. If any of these connections fail, the coverglass to which it attaches can build up to a voltage exceeding the discharge threshold to produce the aforesaid detrimental condition. The charges flow through the serially connected ITO layers 2 and to negative ground terminal 9 at the right hand portion of the figure. Terminal 9 is connected to the right hand cell N-bar 11 via conductor 16.

In the prior art approach illustrated in FIG. 2, the coverglass charge draining devices take the form of electrically conductive epoxy beads 14, which must be disadvantageously affixed to each coverglass, as in the case of the undesirable wires 8 of FIG. 1. The other elements function in the manner explained above and thus they bear the same numbers as corresponding elements of FIG. 1. In both FIGS. 1 and 2, the maximum voltage between any ITO coating and the negative ground terminal is typically 35 volts, well below the detrimental discharge threshold for accumulated coverglass charges.

In accordance with the present invention shown in FIG. 3, the ITO coating 2 is wrapped all of the way around an edge 19 of the coverglass 3, and onto the inner coverglass surface 20. When the coverglass is adhered to the photocell 1 by light transmissive adhesive layer 17, automatic electrical continuity between the ITO coating on the outer surface of each coverglass and the adjacent N-bar-interconnect is provided for preventing the buildup of detrimental charges on top of the coverglasses. Deposition of the deposited ITO layer is easily performed by vacuum deposition, or other methods well known to the skilled worker in the art.

The present invention is now employed in the manufacture of commercial satellites and has eliminated the described tedious prior art techniques.

While preferred embodiments have been described, others will occur to the workers in the art and thus the scope of the invention is to be limited solely by the terms of the following claims and art recognized equivalents thereof. For example, the term "coverglass" would include any light transmissive device for protecting its associated photocell, and is not to be restricted to "glass" in the conventional sense.

We claim:

1. Solar cell apparatus comprising:
   (a) an array of photocells;
   (b) a plurality of photocell protective coverglass members, each member having an edge portion and having an upper light transmissive charge conducting semiconductive layer thereon;
   (c) a plurality of interconnect members each electrically coupled between photocells of said array; and
   (d) wherein each coverglass member has its charge conducting semiconductive layer wrapped around the edge portion of each coverglass member and in electrical contact with an associated interconnect member.

2. The apparatus of claim 1 wherein said charge conducting semiconductive layer is coated upon the edge portion of said coverglass member.

3. The apparatus of claim 1 wherein said charge conducting semiconductive layer comprises a coating of indium tin oxide.

4. The apparatus of claim 2 wherein said charge conducting semiconductive layer comprises a coating of indium tin oxide.

5. Solar cell apparatus comprising:
   (a) an array of serially connected photocells, each photocell having an upper electrode of a first polarity and a lower electrode of a second polarity opposite said first polarity;
   (b) a plurality of protective coverglass members, each member having an edge portion, each coverglass member being positioned over an associated photocell and having an upper light transmissive charge conducting semiconductive layer thereon;
   (c) a plurality of interconnect members each electrically coupled between adjacent pairs of photocells to form said array and each having a first portion connected to the upper electrode of a particular photocell and a second opposite portion connected to the lower electrode of an adjacent photocell to connect said photocells in series; and
   (d) wherein each coverglass member has its charge conducting semiconductive layer wrapped around the edge portion of each coverglass member and in electrical contact with an associated interconnect member.

6. The apparatus of claim 5 wherein said charge conducting semiconductive layer is coated upon the edge portion of said coverglass member.

7. The apparatus of claim 5 wherein said electrodes are metallic layers.

8. The apparatus of claim 6 wherein said electrodes are metallic layers.

9. The apparatus of claim 5 wherein said charge conducting semiconductive layer comprises a coating of indium tin oxide.

10. The apparatus of claim 6 wherein said charge conducting semiconductive layer comprises a coating of indium tin oxide.

11. Solar cell apparatus comprising:
    (a) an array of photocells;
    (b) a plurality of protective photocell coverglass members, each member having an edge portion, and each coverglass member having a light transmissive charge conducting semiconductive layer thereover;
    (c) a plurality of conductive interconnect members electrically coupled between photocells; and
    (d) wherein each coverglass member has its charge conducting semiconductive layer wrapped around the edge portion of each coverglass member for electrically contacting an interconnect member.

12. The apparatus of claim 11 wherein said charge conducting semiconductive layer is coated upon the edge portion of said coverglass member.

13. The apparatus of claim 12 wherein said charge conducting semiconductive layer comprises indium tin oxide.

* * * * *